(12) United States Patent
Brainard

(10) Patent No.: US 6,492,087 B1
(45) Date of Patent: Dec. 10, 2002

(54) POLYMERS AND PHOTORESIST COMPOSITIONS COMPRISING SAME

(75) Inventor: Robert L. Brainard, Wayland, MA (US)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

(21) Appl. No.: 09/507,186

(22) Filed: Feb. 18, 2000

Related U.S. Application Data

(60) Provisional application No. 60/121,383, filed on Feb. 23, 1999.

(51) Int. Cl.[7] ............................................. G03F 7/039
(52) U.S. Cl. .................... 430/270.1; 430/326; 430/905; 430/910
(58) Field of Search ............................ 430/270.1, 905, 430/910, 326

(56) References Cited

U.S. PATENT DOCUMENTS

| | | | |
|---|---|---|---|
| 4,247,611 A | | 1/1981 | Sander et al. ............. 430/286.1 |
| 5,712,078 A | | 1/1998 | Huang et al. ............. 430/270.1 |
| 5,942,367 A | * | 8/1999 | Watanabe et al. ........... 430/170 |
| 6,013,411 A | * | 1/2000 | Aoai et al. ................ 430/270.1 |
| 6,136,502 A | * | 10/2000 | Satochi et al. ............ 430/270.1 |

FOREIGN PATENT DOCUMENTS

| | | |
|---|---|---|
| DE | 196 26 003 A | 1/1997 |
| EP | 0 525 627 A | 2/1993 |
| EP | 0 701 171 A | 1/1998 |
| EP | 0 908 473 A | 4/1999 |
| EP | 0 908 783 | 4/1999 |
| JP | 11-305444 | 11/1999 |

* cited by examiner

*Primary Examiner*—John S. Chu
(74) *Attorney, Agent, or Firm*—Peter F. Corless; Darryl P. Frickey; Edwards & Angell, LLP

(57) ABSTRACT

In a first aspect, polymers of the invention in general comprise a photoacid-labile unit that can generate multiple anions or acidic groups such as hydroxy (particularly phenolic) preferably from a single photoacid-induced polymer deprotection reaction. In a further aspect, polymers of the invention comprise a photoacid-labile unit that generate substantially or essentially no volatile species species during a photoacid-induced deprotection reaction of the polymer to thereby avoid undesired outgassing and/or shrinkage of a resist coating layer containing a polymer of the invention. In particularly preferred aspects of the invention, polymers are provided that combine both aspects, i.e. the polymers contain blocking groups that can generate multiple anions or acid groups preferably from a single photoacid-induced polymer deprotection reaction, and those blocking groups also generate substantially no volatile species during microlithographic processing. Polymers of the invention are particularly useful as components of photoresist compositions, particularly chemically-amplified positive resists.

26 Claims, 6 Drawing Sheets

| FIG. 1A-1 |
| FIG. 1A-2 |
| FIG. 1A-3 |

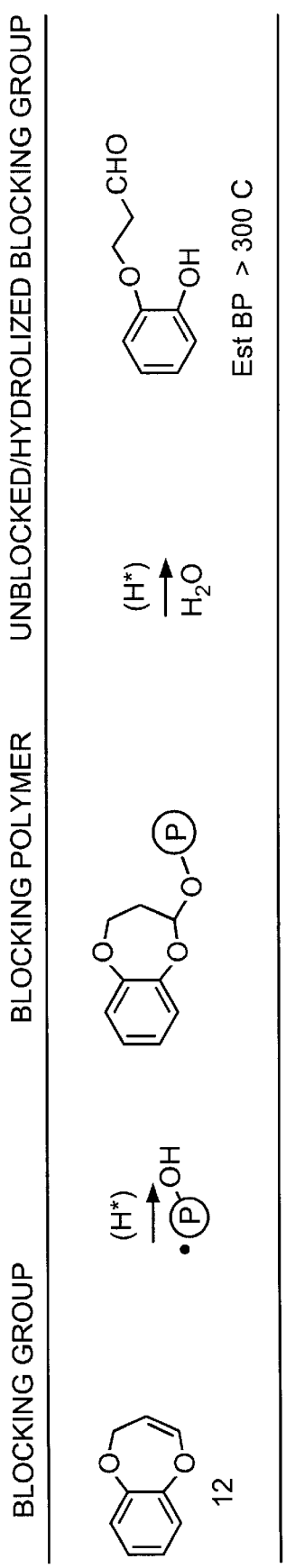
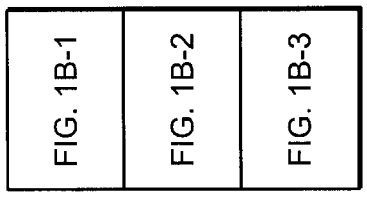
FIG. 1B-1
FIG. 1B

POLYMERS AND PHOTORESIST COMPOSITIONS COMPRISING SAME

This application claims the benefit of U.S. provisional application No. 60/121,383, filed Feb. 23, 1999, which is incorporated herein by reference in its entirety.

BACKGROUND OF THE INVENTION

1. Field of the Invention

The present invention relates to new polymers and use of such polymers as a resin component for photoresist compositions, particularly chemically-amplified positive-acting photoresist compositions. Polymers of the invention comprise groups that can generate multiple anions or acidic groups, and/or generate substantially no volatile species during lithographic processing.

2. Background

Photoresists are photosensitive films used for the transfer of images to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photoinduced chemical transformation of the photoresist coating to thereby transfer the pattern of the photomask to the photoresist-coated substrate. Following exposure, the photoresist is developed to provide a relief image that permits selective processing of a substrate.

A photoresist can be either positive-acting or negative-acting. For most negative-acting photoresists, those coating layer portions that are exposed to activating radiation polymerize or crosslink in a reaction between a photoactive compound and polymerizable reagents of the photoresist composition. Consequently, the exposed coating portions are rendered less soluble in a developer solution than unexposed portions. For a positive-acting photoresist, exposed portions are rendered more soluble in a developer solution while areas not exposed remain comparatively less developer soluble. In general, photoresist compositions comprise at least a resin binder component and a photoactive agent.

More recently, chemically-amplified-type resists have been increasingly employed, particularly for formation of sub-micron images and other high performance applications. Such photoresists may be negative-acting or positive-acting and generally include many crosslinking events (in the case of a negative-acting resist) or deprotection reactions (in the case of a positive-acting resist) per unit of photogenerated acid. In the case of positive chemically-amplified resists, certain cationic photoinitiators have been used to induce cleavage of certain "blocking" groups pendant from a photoresist binder, or cleavage of certain groups that comprise a photoresist binder backbone. See, for example, U.S. Pat. Nos. 5,075,199; 4,968,581; 4,883,740; 4,810,613; and 4,491,628, and Canadian Patent Application 2,001,384. Upon cleavage of the blocking group through exposure of a coating layer of such a resist, a polar functional group is formed, e.g., carboxyl or imide, which results in different solubility characteristics in exposed and unexposed areas of the resist coating layer. See also R. D. Allen et al., *Proceedings of SPIE*, 2724:334–343 (1996); and P. Trefonas et al. *Proceedings of the 11th International Conference on Photopolymers* (*Soc. Of Plastics Engineers*), pp 44–58 (Oct. 6, 1997).

While currently available photoresists are suitable for many applications, current resists also can exhibit significant shortcomings, particularly in high performance applications such as formation of highly resolved sub-half micron and sub-quarter micron features.

SUMMARY OF THE INVENTION

The present invention provides novel polymers and photoresist compositions that comprise a photoactive component and such polymers as a resin component.

In a first aspect, polymers of the invention in general comprise a photoacid-labile unit (sometimes referred to as a "blocking group") that can generate multiple anions or acidic groups such as hydroxy (particularly phenolic) preferably from a single photoacid-induced polymer deprotection reaction.

In a further aspect, polymers of the invention comprise a photoacid-labile unit (i.e. blocking group) generate substantially or essentially no volatile species (e.g. boiling point less than about 180° C. or 200° C.) species during a photoacid-induced deprotection reaction of the polymer to thereby avoid undesired outgassing and/or shrinkage of a resist coating layer containing a polymer of the invention.

In particularly preferred aspects of the invention, polymers are provided that combine both of the above aspects, i.e. the polymers contain blocking groups that can generate multiple anions or acid groups preferably from a single photoacid-induced polymer deprotection reaction, and those blocking groups also generate essentially no volatile species (e.g. boiling point less than about 180° C. or 200° C.) species during a photoacid-induced deprotection reaction of the polymer.

Particularly preferred polymers of the invention comprise one or more acetal, ketal and/or ortho esters photoacid-labile groups (blocking groups) that preferably can generate multiple anions. Unless otherwise specified, references herein to acetal groups are inclusive of both acetal, ketal and ortho ester groups.

A suitable acetal precursor compound or other suitable blocking group precursor may be grafted onto a preformed polymer to provide a polymer with photoacid labile acetal group. Upon exposure to photoacid, the acetal unit is cleaved or deblocked, which can provide an anion or acidic group on the polymer. Moreover, by appropriate selection of the acetal precursor compound, after deblocking, the cleavage product itself can generate a further anion or acidic group.

The generation of multiple anions or acid groups from a single deblocking reaction can provide photoresist relief images of enhanced contrast and resolution. The use of blocking groups that generate substantially or essentially no volatile species avoid undesired outgassing and shrinkage of a resist coating layer containing a polymer of the invention. Such outgassing and shrinkage can compromise resolution of an image patterned in the resist layer as well as damage or at least interfere with the performance of imaging equipment. For example, volatile products of a deblocking reaction can condense on lenses of a stepper or other imaging equipment.

Photoresists of the invention contain a photoactive component, typically a photoacid generator compound, and a resin component that comprises a polymer of the invention. Photoresists of the invention can be imaged with a variety of activating radiation, depending on the photoactive component that is employed. Generally preferred will be deep UV wavelengths (recognized as less than about 300 nm), including 248 nm, and sub-200 nm wavelengths such as 193 nm and 157 nm. Other useful exposure radiation includes E-beam, X-ray, EUV, and ion projection lithography (IPL).

The invention also provides methods for forming relief images, including methods for forming a highly resolved relief image such as a pattern of lines where each line has essentially vertical sidewalls and a line width of about 0.40 microns or less, or even about 0.25 microns or less. The invention further provides articles of manufacture comprising substrates such as a microelectronic wafer or a liquid crystal display or other flat panel display substrate having coated thereon the photoresists and relief images of the invention. Other aspects of the invention are disclosed infra.

DETAILED DESCRIPTION OF THE INVENTION

Figures 1, 1A:
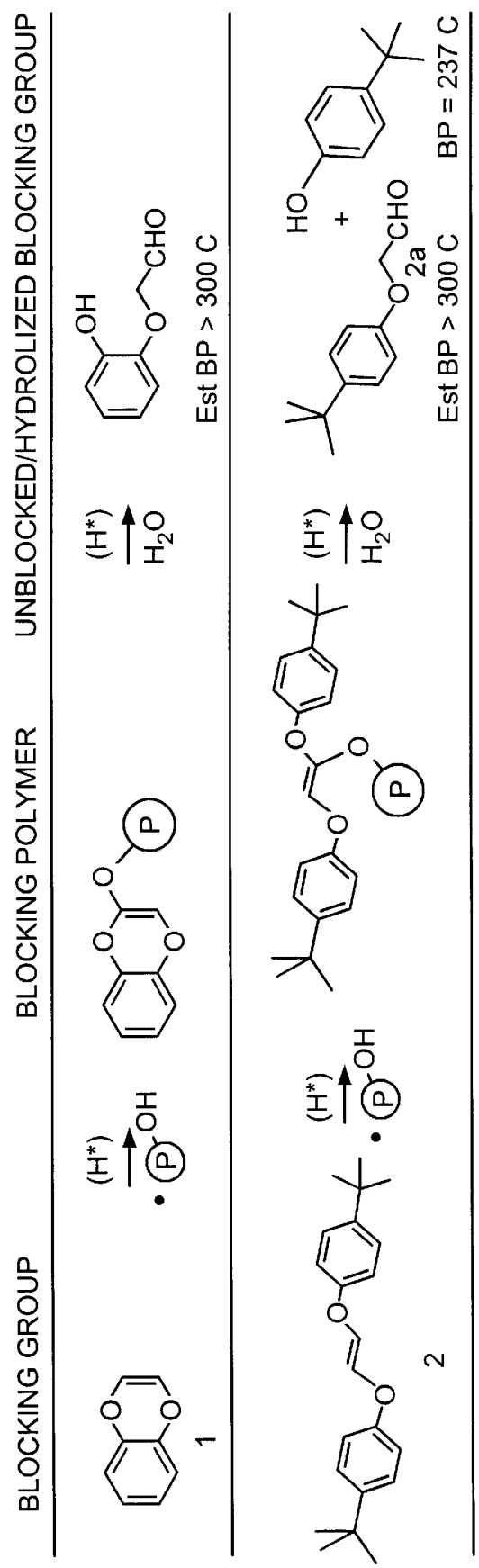
FIGS. 1A and 1B shows selected preferred blocking groups (acetal precursor groups), polymers and unblocked groups of the invention.
Figures 1, 1A, 2:
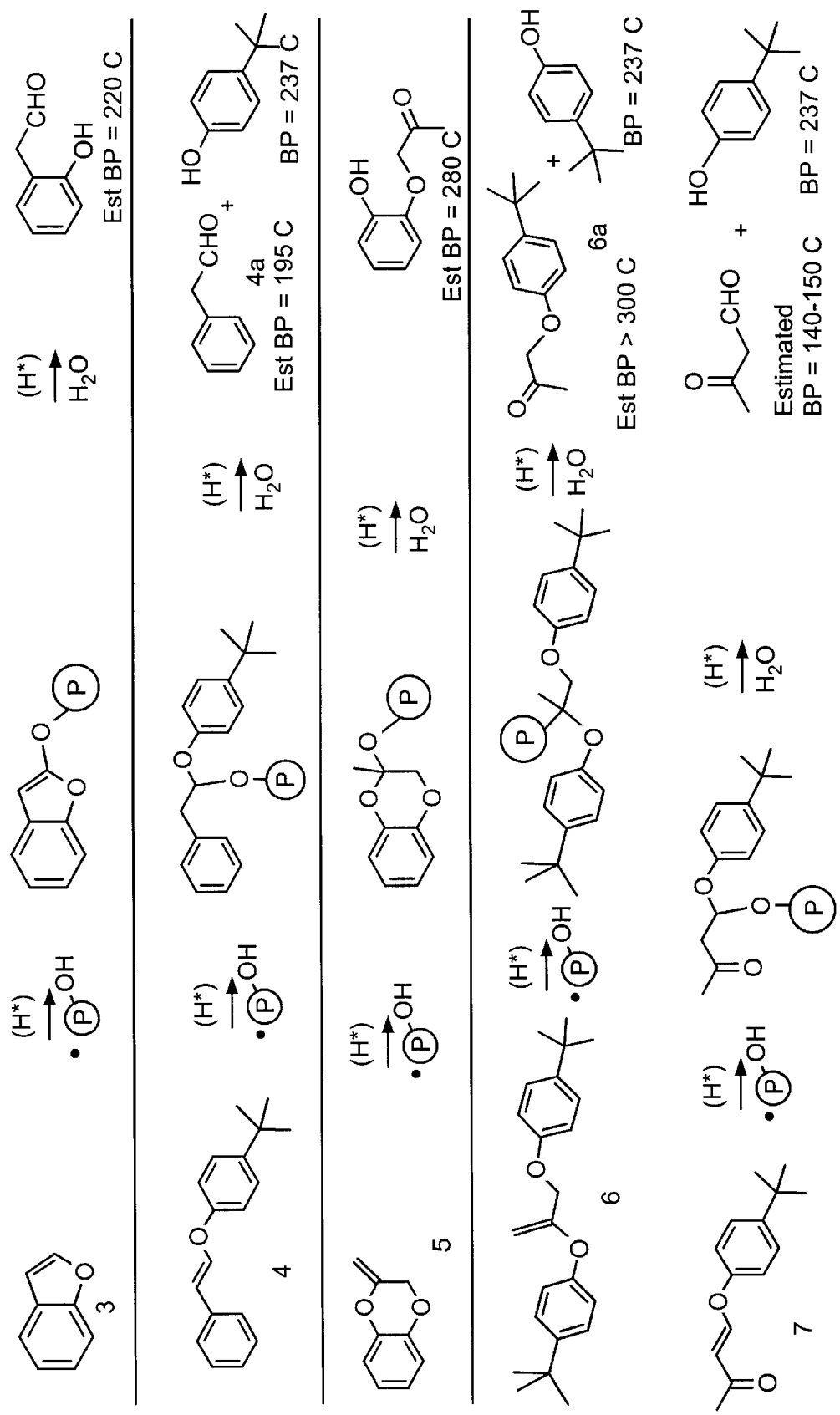
Figures 1, 1A, 2, 3:
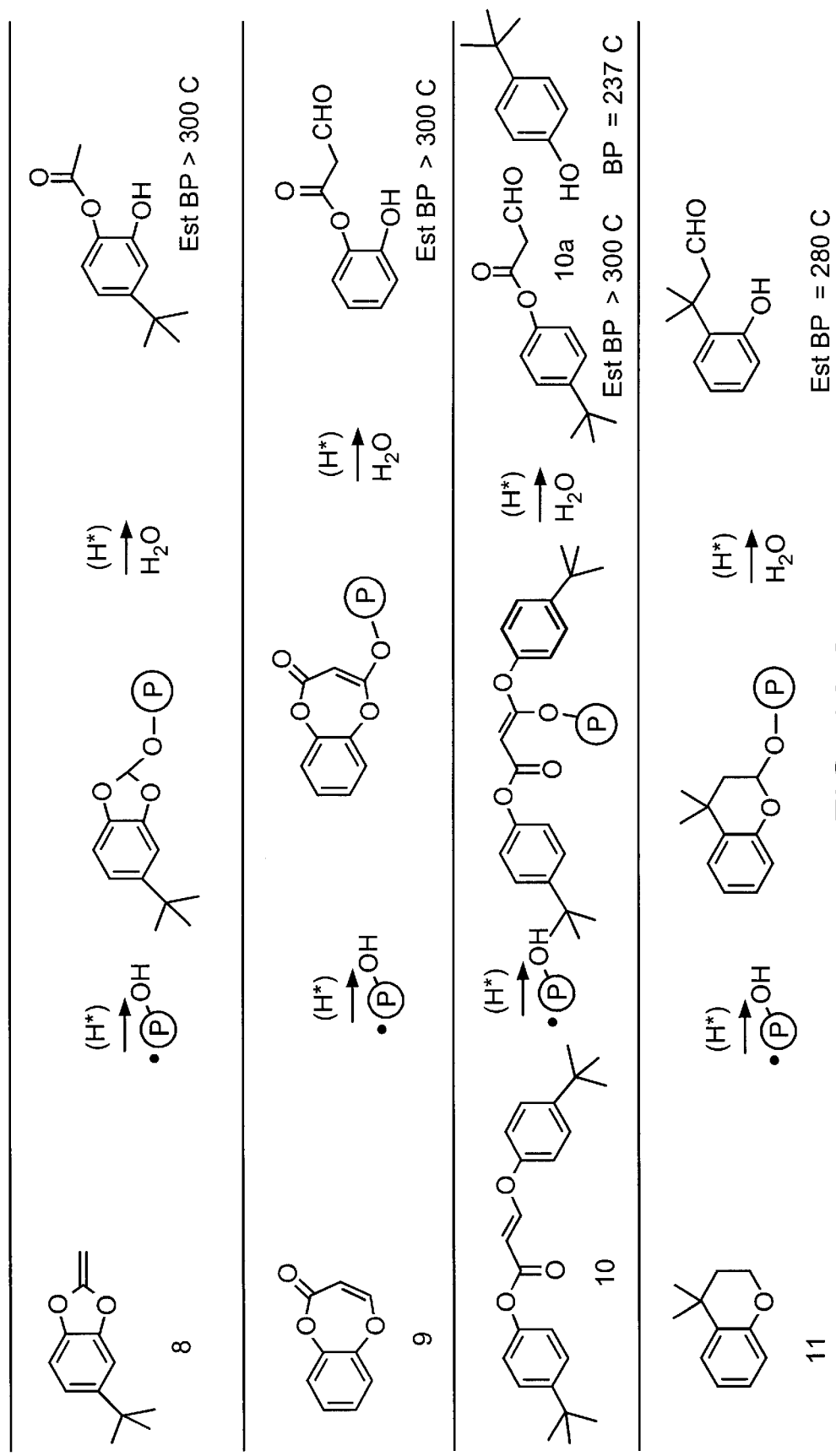

As discussed above, polymers of the invention comprise photoacid-labile groups that are preferably acetal groups (again, as defined above inclusive of acetal, ketal and ortho-esters).

To provide polymer of the invention, a suitable acetal precursor compound or other blocking group precursor may be grafted onto a preformed polymer to provide a polymer with the photoacid-labile acetal group. Upon exposure to photoacid, the acetal unit is cleaved or deblocked, which can provide an anion or acidic group on the polymer. Moreover, by appropriate selection of the acetal precursor compound, after deblocking, the cleavage product itself can generate a further anion or acidic group.

Such multiple anion or acidic group generation is exemplified by the following scheme, where the acetal precursor compound is benzodioxin:

polymer and the base-reactive acetal de-blocked compound (hemi-acetal above), to provide compound 3.

Preferably, the non-polymer cleavage product of the deprotection reaction (1 in the above scheme) is relatively non-volatile, e.g. where the non-polymer cleavage product has a boiling point of at least about 160° C., more preferably a boiling of at least about 180 or 200° C., in order to avoid undesired outgassing and shrinkage during use in photoresist applications.

A variety of acetal groups will be suitable for polymers of the invention, although as discussed above, preferably the non-polymeric cleavage products produced upon photoacid-induced deblocking reaction will be substantially non-volatile under typical lithographic conditions. Hence, preferably a non-polymeric cleavage product will have a boiling point of at least about 180° C., more preferably at least about 200° C.

Substituted vinyl ether compounds are generally preferred acetal precursor compounds, i.e. compounds that include at least one ether linkage and at least one carbon-carbon double bond. The compound may suitably contain more than one ether linkage, e.g. 2, 3 or 4 ether linkages, although more typically an acetal precursor compound will have one or two ether linkages. The acetal precursor also may have more than one carbon-carbon double bond (e.g. 2, 3 or 4 double bonds), although more typically the compound will have one or two carbon-carbon double bonds. Typically at least one of the ether linkages will be directly adjacent (i.e. no other interposed atoms) to a vinyl carbon.

As discussed above, preferably the blocking group precursor compound (such as an acetal precursor compound) or hydrolysis product thereof is substantially or essentially non-volatile, particularly so the compound has a boiling point of at least about 160° C., more preferably at least about 180° C., still more preferably at least about 200° C.

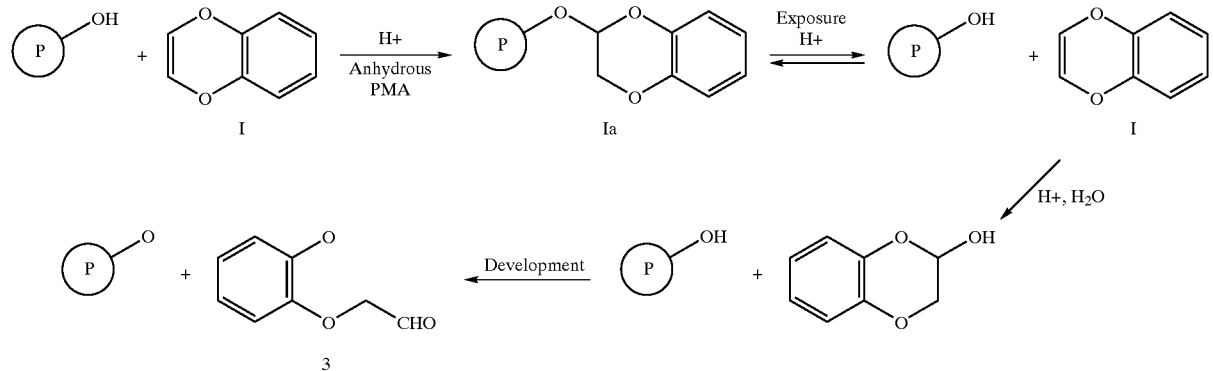

As shown in the above scheme, poly(vinylphenol) or other hydroxy-containing polymer (P)—OH is reacted with the acetal precursor compound benzodioxin 1 to provide the pendant. acetal units of polymer 1a. The polymer and precursor compound 1 are suitably reacted in the presence of acid under anhydrous conditions, typically in an organic solvent.

Exposure of polymer 1a to photoacid results in deblocking of the polymer by reaction of the acetal unit. Hydrolysis of the acetal unit may occur at any of a number of stages during lithographic processing, e.g. during exposure, or after exposure such as during the post-exposure bake. During development, in the presence of aqueous alkaline solution, multiple acidic groups can be provided by the deblocked Similarly, preferred acetal precursor compounds have a molecular weight of at least about 100, more preferably at least about 120, 130, 140 or 150. Suitably acetal precursor compounds may contain one or more rings, such as one or more fused or separate phenyl groups. In general, it is preferred that the photoacid-induced deblocking reaction of the invention produces cleavage products wherein less than about 50 or 60 mole percent of the total cleavage products produced will volatilize under the conditions of lithographic process; more preferably where less than about 40, 30, 20, 10 or 5 mole percent of the total cleavage products produced will volatilize under the conditions of the lithographic process; still more preferably where less than about 0.5, 1 or 2 mole percent of the total cleavage products produced will volatilize under conditions of the lithographic process. Specific lithographic conditions where volatile species could form are the exposure and post-exposure bake (generally no greater than about 160° C. or 180° C.) steps.
Specifically preferred acetal precursor compounds include the following compounds 1 through 46:
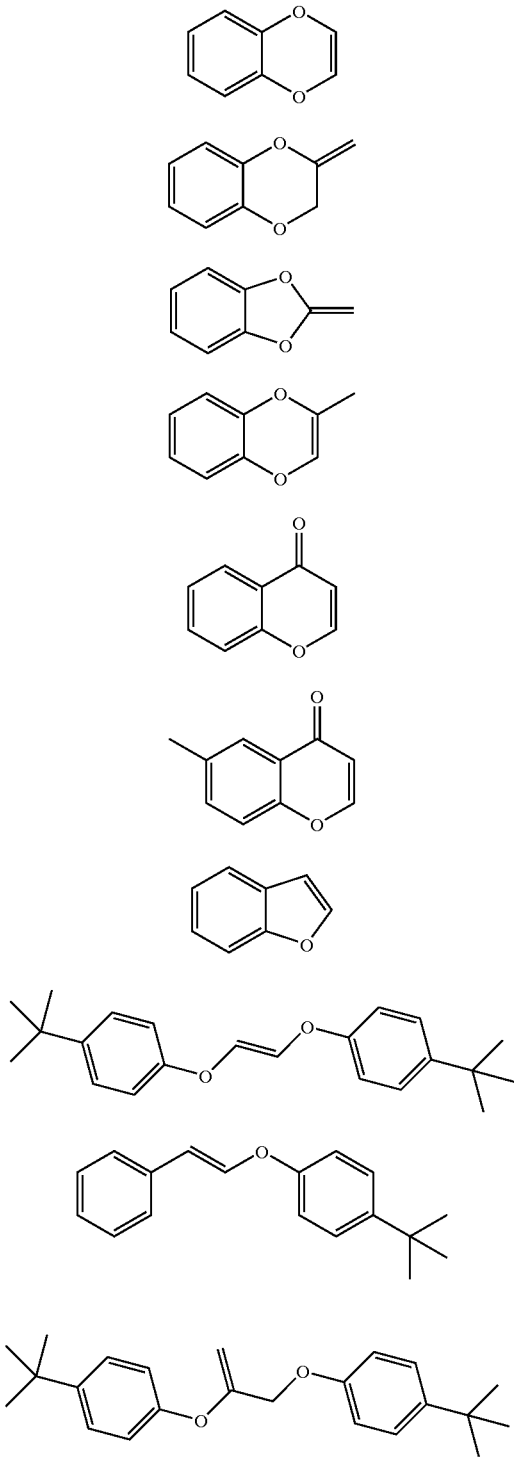
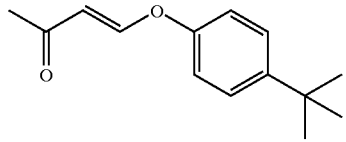
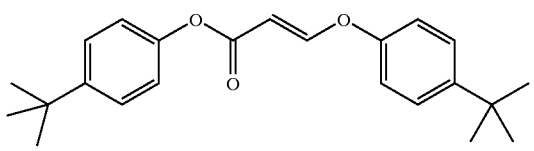
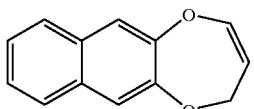
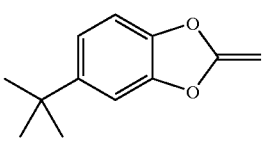
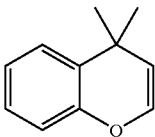
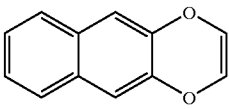
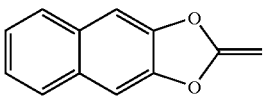
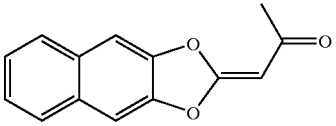
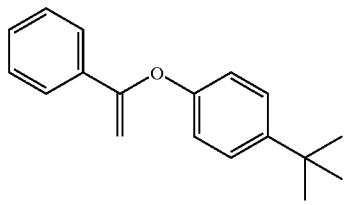
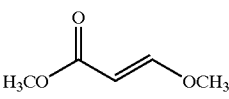
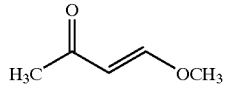

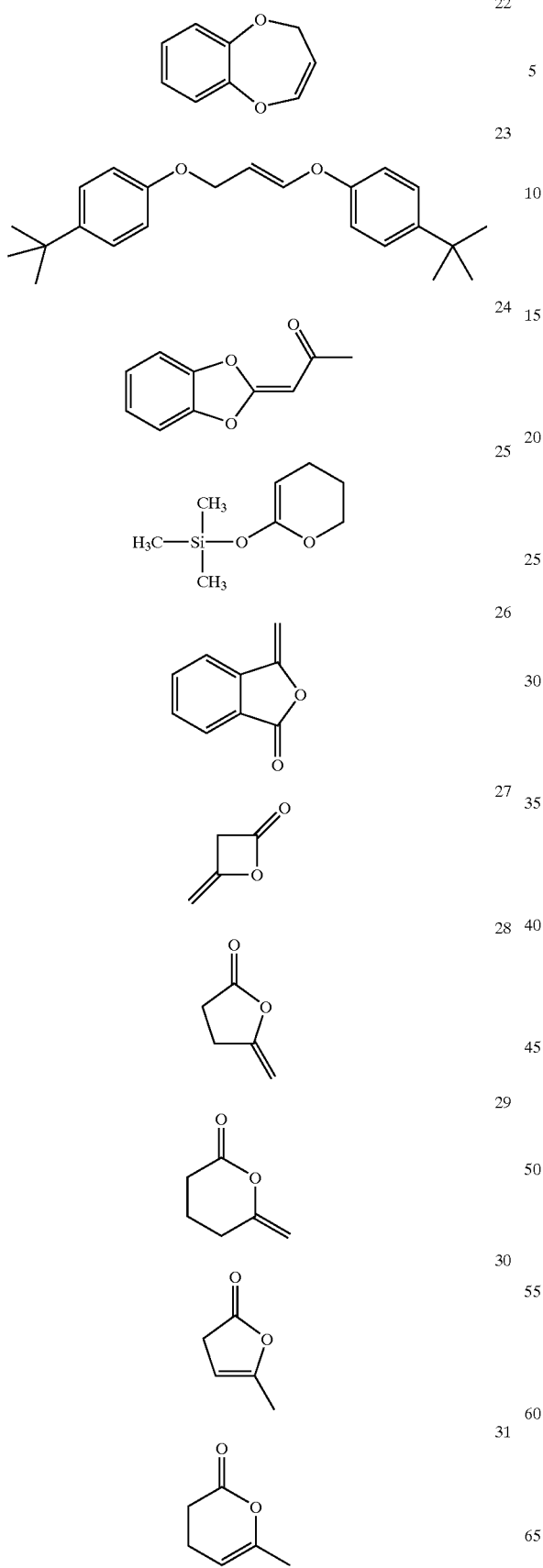
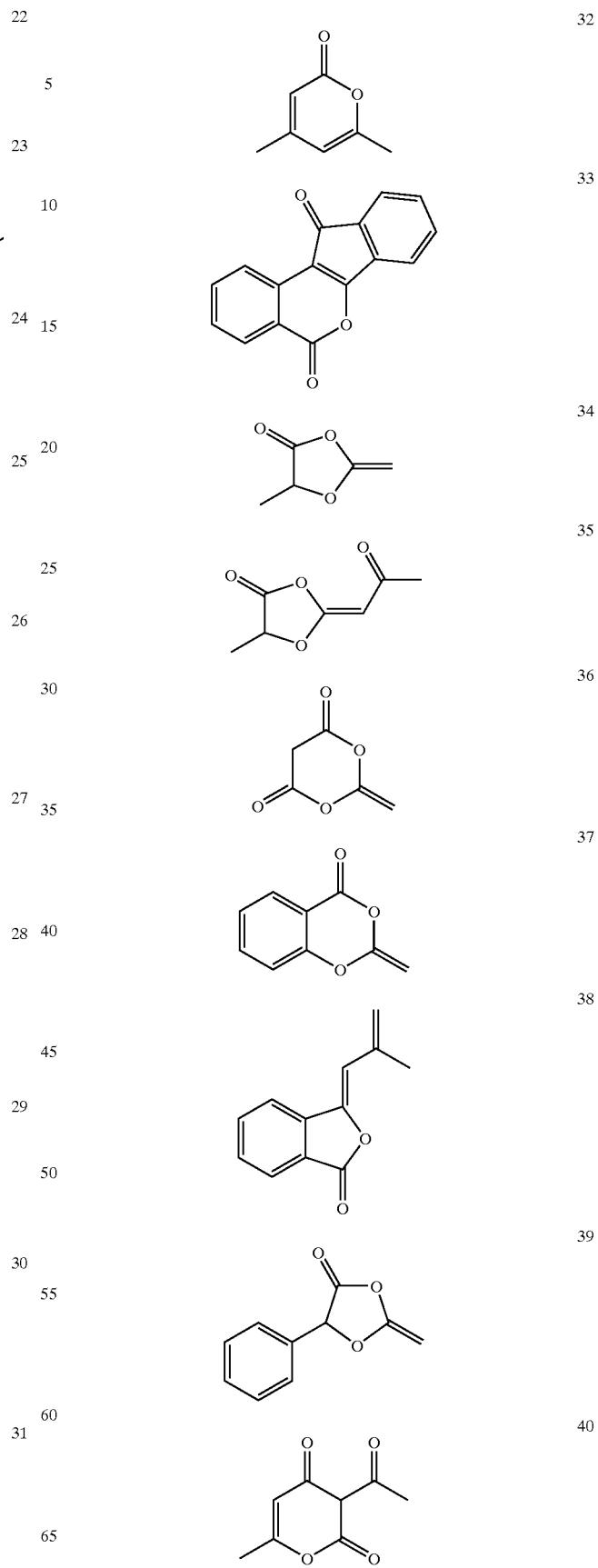

-continued
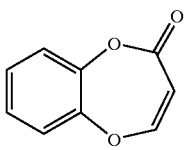
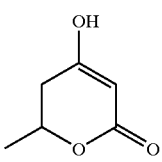
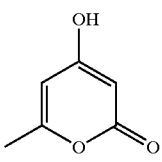
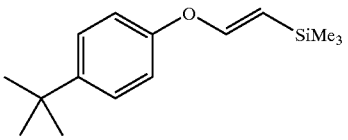
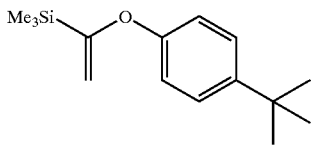
Suitable acetal precursor compounds are commercially available or may be readily prepared, e.g. as depicted in the following Scheme:
Scheme
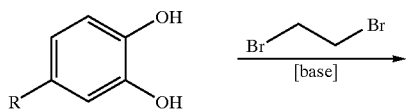
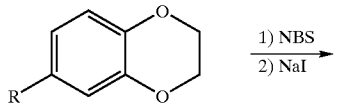
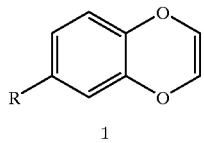
1
-continued
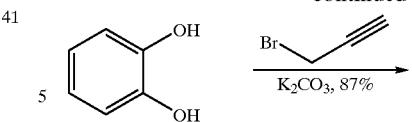
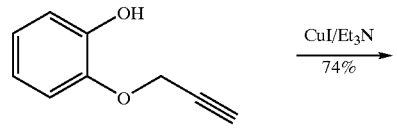
5
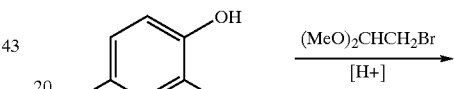
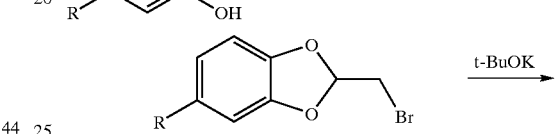
8
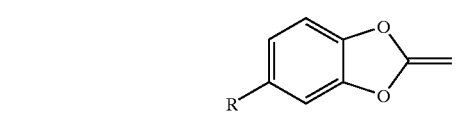
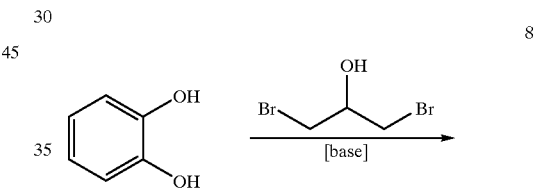
12
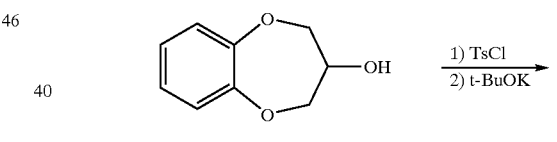
7
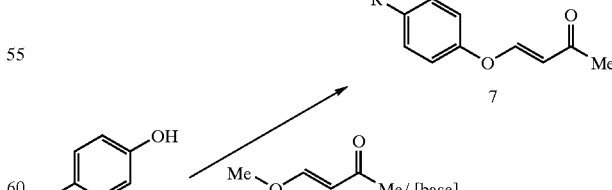
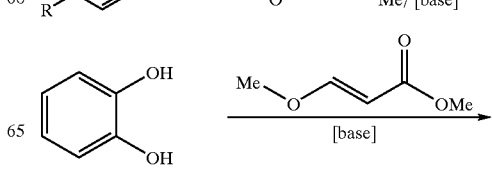

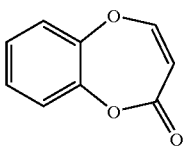

9

As shown in the above Scheme, a dihydroxyaryl compound such as 1,2-dihydroxyphenyl can be reacted with a dihalo compound followed by elimination reaction to provide a fused ring vinyl ether with an endocyclic double bond such as 1 above. See also C. Kashima et al., *J. Org. Chem.* 1987, 52: 5616–5621, which describes such a synthesis. Fused ring vinyl ether with exocyclic double bond can be prepared by reaction of a dihydroxyaryl compound such as 1,2-dihydroxyphenyl with propargyl bromide, as generally depicted in the above Scheme. See also C. Chowdhury et al., *J Org. Chem.* 1998, 63: 1863–1871, which describes such a synthesis. Fused ring vinyl ethers with exocyclic double bonds, but with a 5-member, rather than 6-member, ether ring can be prepared by reaction of a glycolaryl compound such as 1,2-dihydroxyphenyl with bromoacetaldehyde dimethyl acetal, as generally shown in the above Scheme and generally described in P. Zhu et al., *J. Org Chem.* 1995, 60: 5729–5731. Routes to additional acetal precursor compounds are shown in the above Scheme. See also, the Examples which follow, for exemplary preferred syntheses.

Figures 1, 1B, 2:
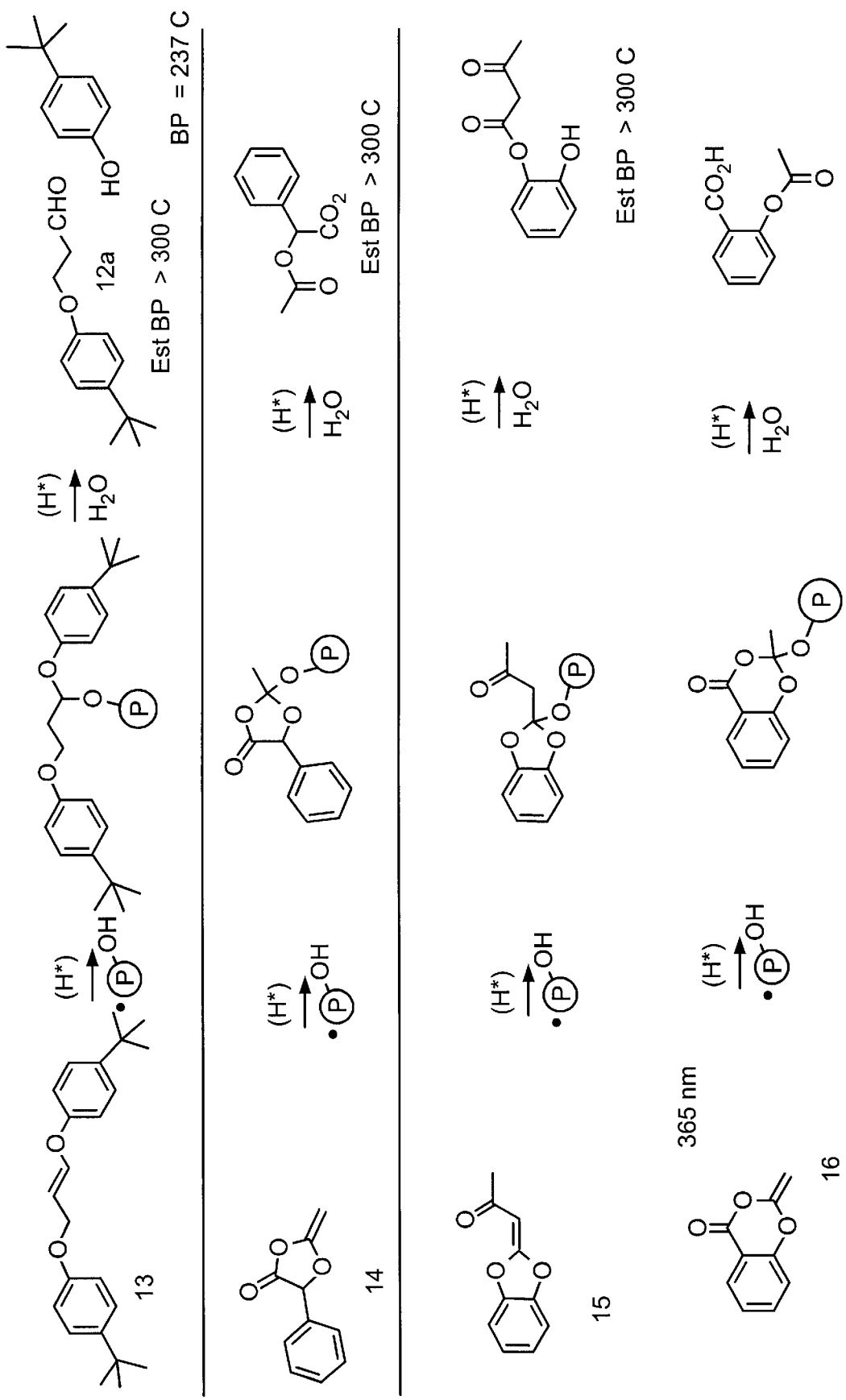
Figures 1, 1B, 2, 3:
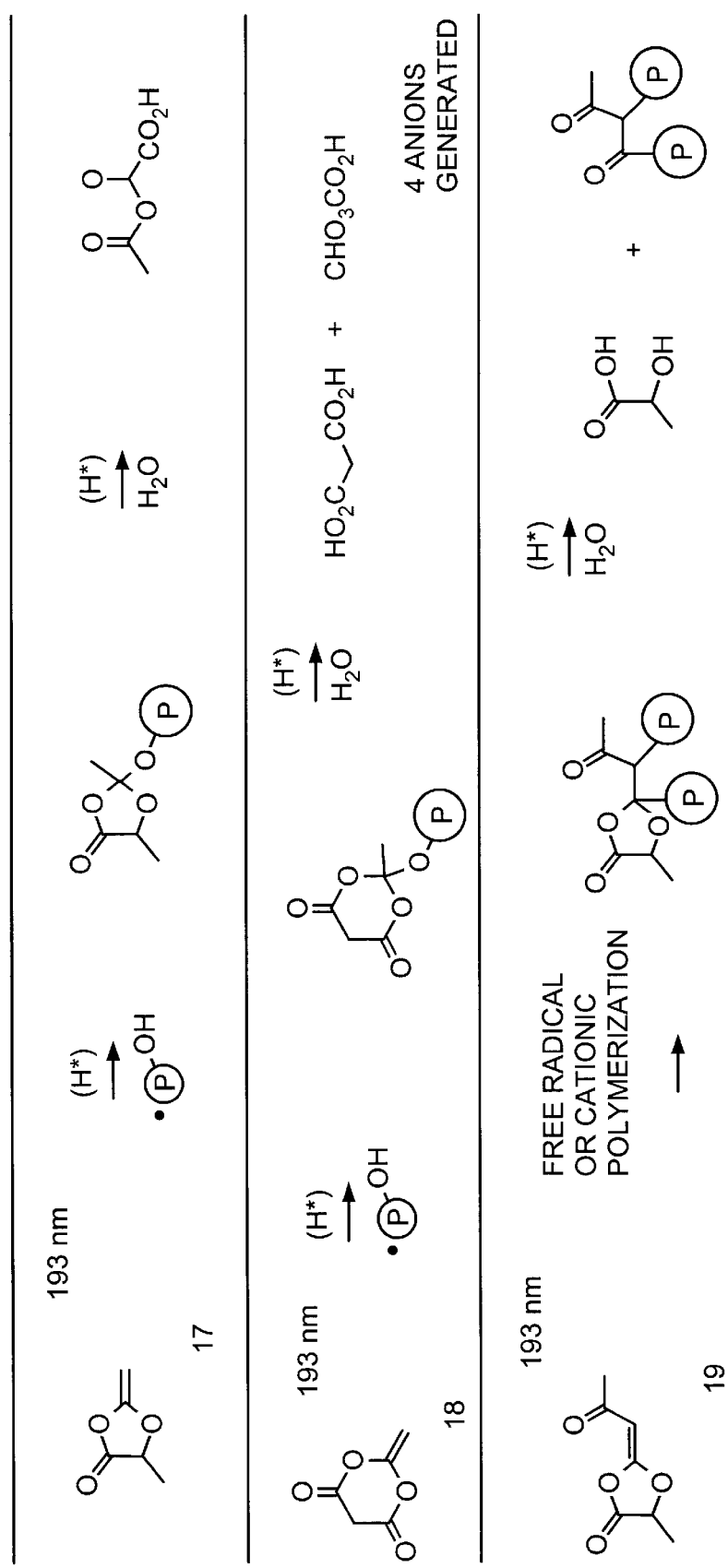

Polymers of the invention may be readily prepared by a variety of methods. A preferred method comprises grafting of an acetal precursor compound onto hydroxyl groups of a preformed polymer under acidic reaction conditions. Such syntheses are specifically depicted in FIGS. 1A and 1B of the drawings. Those FIGS. 1A and 1B also show the non-polymeric cleavage product that can result in a lithographic process by reaction of the polymer of the invention with photogenerated acid. Those FIGS. 1A and 1B also show the blocking group in unblocked and hydrolyzed form. See also, the Examples which follow, for exemplary preferred syntheses of polymers of the invention.

For use in a variety of photoresists, including those at wavelengths of about 248 nm or higher, acetal precursor compounds may be suitably grafted onto hydroxy groups of phenolic polymers and partially hydrogenated novolak resins. Such resins are commercially available and are described e.g. in U.S. Pat. No. 5,128,232 to Thackeray et al.; and U.S. Pat. No. 5,266,440 to Zampini et al. Suitable novolak resins may be prepared by reaction of a phenol, naphthol or a substituted phenol such as cresol, xylenol, etc. with formaldehyde, acetaldehyde, benzaldehyde, etc. Suitable weight average molecular weights may range from 300 to about 100,000 daltons, more preferably from about 1000 to 20000 daltons. Poly(vinylphenols) may be formed by a variety of methods such as block polymerization, emulsion polymerization or solution polymerization of corresponding monomers in the presence of a cationic catalyst. Preferred poly(vinylphenols) suitably have a molecular weight of from about 2,000 to 100,000 daltons. Procedures for preparation of partially hydrogenated poly(vinylphenols) and novolaks are disclosed in U.S. Pat. No. 5,128,232 to Thackeray et al. Such partially hydrogenated resins are particularly useful for use in photoresists imaged at about 248 nm.

Other preferred base polymers to prepare polymers of the invention include a variety of copolymers, particularly copolymers of vinylphenol such as copolymers (including higher order copolymers such as terpolymers) that contain polymerized units of vinylphenol and styrene. Such phenolic copolymers may be suitably prepared by polymerization of vinylphenol (or a suitable precursor) and styrene, t-butylacrylate, t-butylmethacrylate, methyl adamanatyl methacrylate, vinylnapthalene, etc.

For extremely short wavelength applications, e.g. sub-200 nm wavelength imaging applications such as 193 nm and 157 nm, preferably a polymer is employed that is at least substantially free of any phenyl or other aromatic groups. For example, for such sub-200 nm imaging applications, preferred polymers of the invention contain less than 5 mole percent aromatic groups, more preferably less than about 1 mole percent aromatic groups, still more preferably less than about 0.1, 0.05 or 0.01 mole percent aromatic groups. Particularly preferred are polymers that are completely free of aromatic groups. Aromatic groups can be highly absorbing of sub-200 nm radiation and thus are undesirable for polymers used in photoresists imaged with such short wavelength radiation.

Thus, for example, for 193 nm imaging applications, a polymer may be employed that has alicyclic hydroxy groups onto which blocking group precursor compounds are grafted. Suitable alicyclic groups include e.g. polymerized units of vinyl(hydroxyadamantane), vinyl hydroxycyclohexane), 2-hydroxyethylmethacrylate, and the like.

Polymers of the invention may contain additional units than those discussed above such as units provided by condensation methacrylonitrile to provide pendant cyano groups, and the like.

Preferably a polymer of the invention will contain at least about 3 to 5 mole percent of blocking groups of the invention (i.e. that can generate multiple anions or acidic groups) based on total units of the polymer. More typically, a polymer of the invention will contain from about 5 to 80 mole percent of blocking groups of the invention based on total units of the polymer, even more typically from about 8 to about 40 or 50 mole percent of blocking groups based on total units of the polymer.

As discussed above, the resins of the invention are highly useful as the resin component in photoresist compositions, particularly chemically-amplified positive resists.

Photoresists of the invention in general comprise a photoactive component and a resin binder component that comprises a polymer of the invention. The resin binder component is suitably employed in amounts sufficient to provide film-forming properties to the composition and to render a coating layer of the resist developable with an aqueous alkaline developer after exposure.

Resists of the invention suitably comprise a photoacid generator (i.e. "PAG"), suitably in an amount sufficient to generate a latent image in a coating layer of the resist upon exposure to activating radiation. One group of preferred PAGs for use in the resists of the invention include imidosulfonates such as compounds of the following formula:

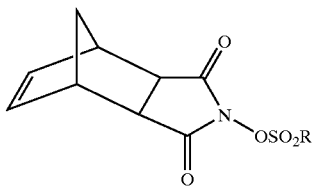

wherein R is camphor, adamantane, alkyl (e g $C_{1-12}$ alkyl) and perfluoroalkyl such as perfluoro($C_{1-12}$alkyl), particularly perfluoro anions of perfluorooctanesulfonate, perfluorononanesulfonate and the like. A specifically preferred PAG is N-[(perfluorooctanesulfonyl)oxy]-5-norbornene-2,3-dicarboximide.

Other sulfonate compounds also may be employed such as sulfonate salts. Two suitable agents are the following PAGs 1 and 2:

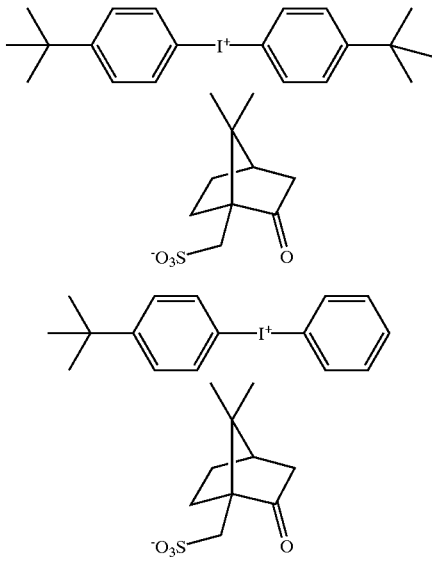

Such sulfonate compounds can be prepared as disclosed in European Patent Application 96118111.2 (publication number 0783136), which details the synthesis of above PAG 1.

Also suitable are the above two iodonium compounds complexed with anions other than the above-depicted groups. In particular, preferred anions include those of the formula $RSO_3^-$ where R is adamantane, alkyl (e.g. $C_{1-12}$ alkyl) and perfluoroalkyl such as perfluoro ($C_{1-12}$alkyl), particularly perfluoro counter anions of perfluorooctanesulfonate, petfluorononanesulfonate and the like.

Particularly preferred PAGs to use in resists of the invention are triarylsulfonfoium salts such as a triphenylsulfonium salt that has any of a variety of counter anions such as camphorsulfonate and the like. Suitable triarylsulfonium salt PAGs, include mixtures thereof, are disclosed in U.S. Pat. No. 5,731,364 to Sinta et al. of the Shipley Company.

Other known PAGs also may be employed in the resists of the invention. For example, N-sulfonyloxyimides may be employed such as those described in International application WO94/10608, or non-ionic halogenated PAGs that generate a halogen acid (e.g. HBr) upon exposure to activating radiation as described e.g. in U.S. Pat. No. 5,128,232 to Thackeray et al. and in European Patent Application Nos. 0164248 and 0232972. Diazo PAGs also may be employed for use as a photoactive component in PAGs of the invention, such as the PAGs reported in U.S. Pat. No. 5,468,589.

A preferred optional component of resist compositions of the invention is a dye compound. Preferred dyes can enhance resolution of the patterned resist image, typically by reducing reflections and the effects thereof (e.g. notching) of the exposure radiation. Preferred dyes include substituted and unsubstituted phenothiazine, phenoxazine, anthracene and anthrarobin compounds. Preferred substituents of substituted phenothiazine, phenoxazine, anthracene and anthrarobin include e.g. halogen, $C_{1-12}$ alkyl, $C_{1-12}$ alkoxy, $C_{2-12}$ alkenyl, $C_{1-12}$ alkanoyl such as acetyl, aryl such as phenyl, etc. Copolymers of such compounds also may be used as a dye, e.g. an anthracene acrylate polymer or copolymer.

Another preferred optional additive is an added base, particularly tetrabutylammonium hydroxide (TBAH), or a lactate salt of TBAH, which can enhance resolution of a developed resist relief image. Other useful base additives will include alkyl and aryl amines and pyridines. The added base is suitably used in relatively small amounts, e.g. about 1 to 20 percent by weight relative to the photoactive component (PAG).

Photoresists of the invention also may contain other optional materials. For example, other optional additives include anti-striation agents, plasticizers, speed enhancers, etc. Such optional additives typically will be present in minor concentration in a photoresist composition except for dyes which may be present in relatively large concentrations such as, e.g. in amounts of from about 5 to 30 percent by weight of the total weight of a resist's dry components.

The compositions of the invention can be readily prepared by those skilled in the art. For example, a photoresist composition of the invention can be prepared by admixing the components of the photoresist in a suitable solvent such as, for example, ethyl lactate, a glycol ether such a 2-methoxyethyl ether (diglyme), ethylene glycol monomethyl ether, propylene glycol monomethyl ether, propylene glycol monomethyl ether acetate; a Cellosolve ester such as methyl ethyl ketone; 3-ethoxy ethyl propionate; and 2-heptanone. Typically, the solids content of the composition varies between about 2 and 35 percent by weight of the total weight of the photoresist composition. The resin binder and PAG components should be present in amounts sufficient to provide a film coating layer and formation of good quality latent and relief images.

The compositions of the invention are used in accordance with generally known procedures. The liquid coating compositions of the invention are applied to a substrate such as by spinning, dipping, roller coating or other conventional coating technique. When spin coating, the solids content of the coating solution can be adjusted to provide a desired film thickness based upon the specific spinning equipment utilized, the viscosity of the solution, the speed of the spinner and the amount of time allowed for spinning.

The resist compositions of the invention are suitably applied to substrates conventionally used in processes involving coating with photoresists. For example, the composition may be applied over silicon or silicon dioxide wafers for the production of microprocessors and other integrated circuit components. Aluminum-aluminum oxide, gallium arsenide, ceramic, quartz or copper substrates also may be employed. Substrates used for liquid crystal display and other flat panel display applications are also suitably employed, e.g. glass substrates, indium tin oxide coated substrates and the like.

Following coating of the photoresist onto a surface, it is dried by heating to remove the solvent until preferably the photoresist coating is tack free. Thereafter, it is imaged in a pattern by appropriate activating radiation. For example, the activating radiation can be at a wide range of wavelengths depending on the resist components, such as about 365 nm, 248 nm, 193 nm, 157 nm or even shorter wavelengths such as about 20 nm or less (including from about 0.5 to 20 nm). In addition, the activating radiation can be comprised of ion or electron beams. The pattern generated can be formed by passing through a mask or (e.g., in the case of ion or electron beams) could be formed by scanning a narrow beam over areas to be exposed.

The exposure should be sufficient to effectively activate the photoactive component of the photoresist system to produce a patterned image in the resist coating layer and, more specifically, the exposure energy typically ranges from about 1 to 300 mJ/cm$^2$, dependent upon the exposure tool and the components of the photoresist composition.

Coating layers of the resist compositions of the invention can be photoactivated by a wide range of activating radiation. Deep UV exposure will be preferred for many applications, i.e. about 350 nm or less. A particularly preferred exposure wavelength is about 248 nm. Sub-200 nm exposure wavelengths also will be suitable for many applications, including 193 nm and 157 nm. Also preferred will be extremely short wavelength exposures, such as sub-20 nm lithography (e.g. EUV and X-ray) as well as electron beam and ion beam lithographies.

Following exposure, the film layer of the composition is preferably baked at temperatures ranging from about 70° C. to about 150° C. In at least some cases, however, a post-exposure bake may not be necessary to achieve optimal imaging. Thereafter, the film is developed. The exposed resist film is rendered positive working by employing a polar developer, preferably an aqueous based developer such as an inorganic alkali exemplified by sodium hydroxide, potassium hydroxide, sodium carbonate, sodium bicarbonate, sodium silicate, sodium metasilicate, quaternary ammonium hydroxide solutions such as a tetra-alkyl ammonium hydroxide solution; various amine solutions such as ethyl amine, n-propyl amine, diethyl amine, di-n-propyl amine, triethyl amine, or methyldiethyl amine; alcohol amines such as diethanol amine or triethanol amine; cyclic amines such as pyrrole, pyridine, etc. In general, development is in accordance with art recognized procedures.

Following development of the photoresist coating over the substrate, the developed substrate may be selectively processed on those areas bared of resist, for example by chemically etching or plating substrate areas bared of resist in accordance with procedures known in the art. For the manufacture of microelectronic substrates, e.g., the manufacture of silicon dioxide wafers, suitable etchants include a gas etchant, e.g. a chlorine or fluorine-based etchant such a $CF_4$ or $CF_4/CHF_3$ etchant applied as a plasma stream. As discussed above, the compositions of the invention are highly resistant to such etchants thereby enabling manufacture of highly resolved features, including lines with sub-micron widths. After such processing, resist may be removed from the processed substrate using known stripping procedures.

All documents mentioned herein are fully incorporated herein by reference. The following non-limiting examples are illustrative of the invention.

General Comments

All reagents were purchased from Aldrich Chemical Co. and used without further purification. All reactions were run under nitrogen excepts NMR experiments. All spectra were recorded in $CDCl_3$ of $(CD_3)_2CD$ solvent using 300 MHz GE instrument. All chemical shifts are reported in part per million (ppm) downfield of the $Me_4Si$ as a reference. All solvents were removed by rotary evaporation unless noted. Thin layer chromatography (TLC) or high pressure liquid chromatography (HPLC) were used to monitor the reactions.

EXAMPLES 1–3

Syntheses of Deblocking Precursor Compounds

EXAMPLE 1

Synthesis of Mono-prop-2-ynylated Catechol

The title product was prepared according to a modification of the synthesis reported in C. Chowdhury et al., *J. Org. Chem.* 63:1863 (1998). Briefly, to a solution of dry acetone (500 mL) in 1000 mL three-neck flask was added catechol (74.04 g, 672.44 mmol) and $K_2CO_3$ (46.47 g, 336.22 mmol). The reaction mixture was stirred for 1 h at room temperature. Propargyl bromide (80% wt solution in toluene, 100 g, 672.44 mmol) was added slowly in 3 h using a dropping funnel. The mixture was refluxed for 16 h. Solids were removed by filtration. Acetone was removed under reduced pressure. The residue was extracted with $CH_2Cl_2$ (400 mL, 3 times) and water (200 mL). The combined organic layers were dried under $MgSO_4$ anhydrous, and concentrated. The crude product was purified by the method of recrystalization from water. The crystals were obtained in 43.6 g (43.8%); mp 43–45° C. $^1H$ NMR ($CDCl_3$, $Me_4Si$) δ2.56 (t, J=2 Hz, 1H), 4.77 (d, J=2 Hz, 2H), 5.60 (s, 1H), 6.8–7.0 (m, 4).

EXAMPLE 2

Synthesis of 2,3-dihydro-2-methylene-1,4-benzodioxin

The title compound was prepared according to a modification of the synthesis reported in C. Chowdhury et al., *J. Org. Chem.* 63:1863 (1998). Briefly, mono-prop-2-ynylated catechol (10.48 g, 70.8mmol) was dissolved in $Et_3N$ (200 mL). To this solution was added CuI (0.944 g, 4.96 mmol). It was stirred at room temperature for 1 h, then at 100° C. for 4h. The reaction was monitored by TLC. Only one spot was observed on TLC plates. $Et_3N$ was removed under reduced pressure. The residue was extracted with ether (3 times, 300 mL each) and water (200 mL). The combined organic layers were dried under $MgSO_4$ anhydrous, filtered, and concentrated under reduced pressure. The crude product was dissolved in 500 mL of $CH_2Cl_2$ and passed through a short column of neutral $Al_2O_3$ (5 g, column: 41 mm I.D.×45.7 cm L). The pure product was obtained in 7.0 g (67% yield) as an oil. $^1H$ NMR ($CDCl_3$, $Me_4Si$) δ4.34 (d, J=1 Hz, 1H), 4.49 (s, 2H), 4.74 (d, J=1 Hz, 1H), 6.8–7.0 (m, 4).

EXAMPLE 3

Synthesis of 3-(2'-hydroxy-2'methylpropyledine) phthalide

The title compound was prepared as generally described in N. G. Kundu et al., *J. Chem. Soc., Perkin Trans.*, 1: 561 (1998). A mixture of o-iodobenzoic acid (12.4 g, 50 mmol), palladium(II) acetate (0.561 g, 2.5 mmol), triphenylphosphine (0.656 g, 2.5 mmol), and copper(l) iodide (0.476 g, 2.5 mmol) was stirred in dried DMF (150 mL). After 1 h at room temperature, 2-methyl-3-butyn-2-ol (8.2 g, 100 mmol) was added. After additional 1 h at room temperature, the reaction mixture was heated to 60° C. for 16 h. DMF was removed under reduce pressure. The residue was extracted with CH₂Cl₂ (400 mL, 3 times) and water (200 mL). The combined organic layers were dried under MgSO₄ anhydrous, and concentrated. The crude product was recrystalized from petroleum ether.

EXAMPLE 4

NMR Deblocking Study of Angelicalactone with t-butylphenol

To a vial was added t-butylphenol (0.030 g, 0.2 mmol) and angelicalactone (0.020 g, 0.018 mL, 0.2 mmol) in 1 mL of CDCl₃. To this mixture was added CF₃COOH (10% mole). The mixture was transferred to an NMR tube. It was put in a water bath at 55° C. The reaction was monitored by NMR. After 24 h, the reaction was complete. $^1$H NMR (CDCl₃, Me₄Si) δ1.30 (s, 9H), 1.66 (s, 3H), 2.3–2.4 (m, 1H), 2.5–2.8 (m, 3H), 7.01 (d, J=8 Hz, 2H), 7.31 (d, J=8 Hz, 2H). H₂O (1 equivalent, 0.2 mmol, 0.0036 g, 0.0036 mL) was added to the NMR tube. It was shaken vigorously. The reaction was monitored by NMR. After 24 h at room temperature, a new product was observed, having the following NMR: $^1$H NMR (CDCl₃, Me₄Si) δ2.25 (s, 3H), 2.60 (t, J=8 Hz, 3H), 2.82 (t J=8 Hz, 3H), 12.00 (br, 1H).

EXAMPLE 5

NMR Deblocking Study of 2,3-dihydro-2-methylene-1,4-benzodioxin and t-butylphenol In this Example, a similar procedure was employed as described above in Example 4 of that NMR study of angelicalactone and t-butylphenol. The scale of the reaction was 0.14 mmol with 0.1 equivalent of CF₃COOH. The water bath was 55° C. After 10 h at this temperature, the reaction was complete. The NMR of the product was as follows: $^1$H NMR (CDCl₃, Me₄Si) δ1.28 (s, 9H), 1.53 (s, 3H), 3.96 (d, J=11Hz, 1H), 4.39 (d, J=11 Hz, 1H), 6.9–7.0 (m, 6H), 7.26 (d, J=9 Hz, 2H). To this NMR tube was added 1 equivalent of H2O (0.14 mmol, 0.0025 mL). The reaction was monitored at room temperature and at 100° C. oil bath. After 3 days in 100° C. oil bath, a new product was identified, having the following NMR: $^1$H NMR (CDCl₃, Me₄Si) δ1.61 (s, 3H), 3.86 (d, J=11 Hz, 1H), 4.11 (d, J=11 Hz, 1H), 5.7 (br, 1H), 6.8–7.0 (m, 4),

EXAMPLES 6–7

Polymer Syntheses

EXAMPLE 6

Synthesis of poly(p-Angelicalactone styrene)-polyhydroxystyrene(PHS-AL/PHS)

Dried polyhydroxystyrene (25.1 g, 0.21 mol) was dissolved in 75 g propylene glycol methyl ether acetate (PGMEA). Methane sulfonic acid (0.66 g, 6.9×10⁻³ mol) in PGMEA (total 1 g) was added in the light yellow solution, then αα-angelicalactone (6.8 g, 0.069 mol) was added. The mixture solution was heated at 120° C. under nitrogen for 16 hours. 20 g basic ion exchange resin IRA-67 was added in the solution and it was rolled for 2 hours. After filtrated of ion exchange beads, the brown solution was added in 700 mL methylene chloride dropwise. The precipitate was filtrated and washed with methylene chloride (5×100 mL). The collected solids were dried under vacuum overnight. An earth yellow solid (25.5 g, 80% yield) was obtained.

$^1$H NMR 300 MHz (δ, (CD)₃CO): 8.00, 6.88, 6.66, 3.08, 2.88, 2.77, 2.16, 2.09, 2.08, 1.51, 1.34.

$^{13}$C NMR 75.48 MHz (δ, (CD)₃CO): 171.7, 169.5, 156.1, 155.6, 149.4, 144.5–143.3 (20 lines), 138.2–136.3 (27 lines), 130.1–128.2 (7 lines), 121.8, 121.7, 121.2, 116.4–114.7 (7 lines), 45.9–42.4 (64 lines), 41.0–38.2 (8 lines), 31.0, 30.9, 30.8, 28.6, 21.0. Percentage blocking of PHS was measured with quantitative $^{13}$C NMR in presence of chromium acetylacetonate which gave an average 28mol %.

EXAMPLE 7

Synthesis of Poly(p-methylbenzenedioxane ether styrene)-polyhydroxystyrene (PHS-MBD/PHS)

Dried polyhydroxystyrene (12.5 g, 0.104 mol) was dissolved in 41.2 g propylene glycol methyl ether acetate (PGMEA). Trifluoroacetic acid (0.20 g, 1.8×10⁻³ mol) in PGMEA (total 1 g) was added in the light yellow solution, then methylbenzenedioxene (MBD 5.1 g, 0.035 mol) was added. The mixture solution was heated at 62° C. under nitrogen for 5 hours, then 100° C. for 2 hours and 64° C. for 15 hours. 15 g basic ion exchange resin IRA-67 was added in the solution and it was rolled for 2 hours. After filtrated of ion exchange beads, the light brown solution was added in 500 mL methylene chloride dropwise. The precipitate was filtrated and washed with methylene chloride (5×100 mL). The collected solids were dried under vacuum overnight. A yellowish powder (7.0 g, 40% yield) was obtained.

$^1$H NMR 300 MHz (δ, (CD)₃CO): 8.02, 6.90, 6.65, 6.59 (br. m, 20H); 4.39 (br. s, 1H); 4.00 (br. s, 1H); 2.25, 1.86, 1.45 (br. m, 15H).

$^{13}$C NMR 75.48 MHz (6, (CD)₃CO): 155.7, 151.7, 143.6, 141.6, 143.2–141.4 (14 lines), 138.4–136.2(26 lines), 129.9, 129.1, 128.3, 123.3–122.1 (7 lines), 118.2–14.8 (18 lines), 97.8, 70.4, 47.7–42.5 (69 lines), 40.8, 40.2, 40.1, 31.1, 30.9, 30.8, 20.6. Percentage blocking of PHS was measured with quantitative $^{13}$C NMR in presence of chromium acetylacetonate which gave an average 25 mol %.

EXAMPLE 8

Photoresist Preparation and Lithographic Processing

A photoresist of the invention is prepared by mixing the following components with amount expressed as weight percents based on total weight of the resist composition:

| Resist components | Amount (wt. %) |
| --- | --- |
| Resin binder | 15 |
| Photoacid generator | 4 |
| Propylene glycol monoethyl ether acetate (PGMEA) | 81 |

The resin binder is the poly(p-methylbenzenedioxane ether styrene)-polyhydroxystyrene prepared as described in Example 7 above. The photoacid generator is di-(4-t-butylphenyl)iodonium (+/−)-1 0-camphor sulfonate (PAG 1 above). Those resin and PAG components are admixed in the PGMEA solvent.

The formulated resist composition is spin coated onto HMDS vapor primed 4 inch silicon wafers and softbaked via a vacuum hotplate at 90° C. for 60 seconds. The resist coating layer is exposed through a photomask at 248 nm, and then the exposed coating layers are post-exposure baked (PEB) at about 110° C. The coated wafers are then treated with 0.26N aqueous tetramethylammonium hydroxide solution to develop the imaged resist layer and provide a relief image. coating layers are post-exposure baked (PEB) at about 110° C. The coated wafers are then treated with 0.26N aqueous tetramethylammonium hydroxide solution to develop the imaged resist layer and provide a relief image.

The foregoing description of the invention is merely illustrative thereof, and it is understood that variations and modification can be made without departing from the spirit or scope of the invention as set forth in the following claims.

What is claimed is:

1. A photoresist composition comprising a photoactive component and a resin binder that comprises a polymer that comprises a photoacid-labile unit that can generate multiple anions or acidic groups from a photoacid-induced deprotection reaction, the polymer being substantially free of aromatic groups.

2. A photoresist composition of claim 1 wherein the photoacid-labile unit is an acetal unit.

3. A photoresist composition of claim 1 wherein the photoacid-labile unit generates substantially no volatile species during exposure and post-exposure baking of a coating layer of the photoresist composition.

4. A photoresist composition of claim 1 wherein the polymer is completely free of aromatic units.

5. A photoresist composition of claim 1 wherein the polymer is not crosslinked to another polymer.

6. A photoresist comprising a photoactive component and a resin binder that comprises a polymer that comprises a photoacid-labile unit that can generate multiple anions or acidic groups from a single photoacid-induced deprotection reaction, and wherein the polymer is not crosslinked to another polymer.

7. A photoresist composition of claim 6 wherein the photoacid-labile unit is an acetal unit.

8. A photoresist composition of claim 6 wherein the photoacid-labile unit generates substantially no volatile species during exposure and post-exposure baking of a coating layer of the photoresist composition.

9. A photoresist composition of claim 6 wherein the polymer comprises phenolic units.

10. A photoresist composition of claim 1 or 6 wherein the polymer is provided by reaction with a compound selected from the group consisting of:

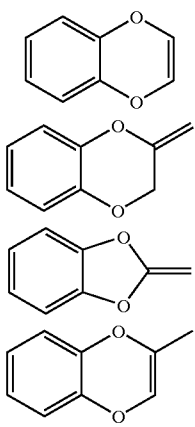

-continued

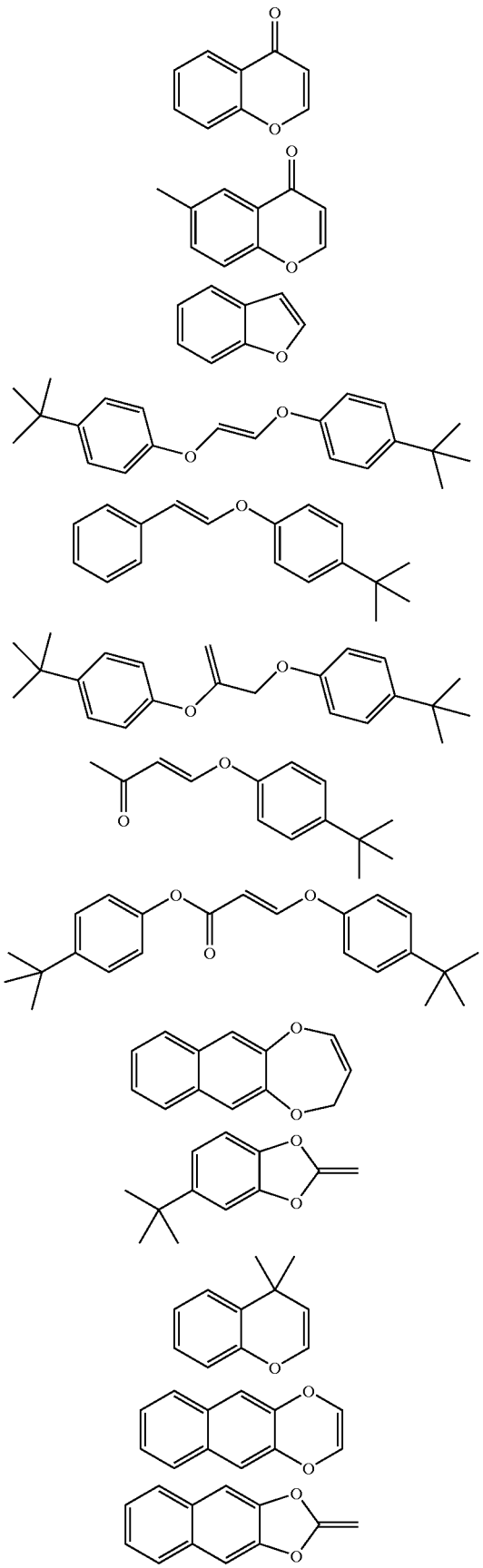

-continued

-continued

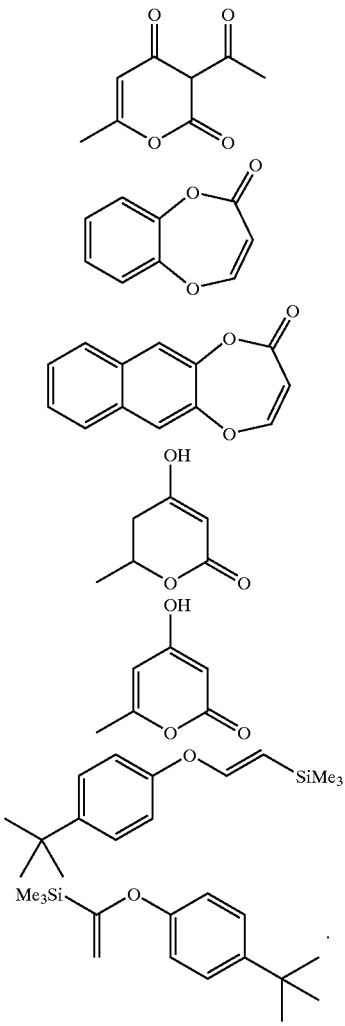

11. A method for forming a photoresist relief image on a substrate, comprising:

a) applying a coating layer of a photoresist composition on a substrate, the photoresist comprising a photoactive component and a resin binder that comprises a polymer that is substantially free of aromatic groups and comprises a photoacid-labile unit that can generate multiple anions or acidic groups from a photoacid-induced deprotection reaction; and b) exposing and developing the photoresist coating layer to provide a relief image on the substrate.

12. The method of claim 11 wherein exposure results in a deblocking reaction of the polymer of the photoresist composition and provides a cleavage product of the polymer.

13. The method of claim 12 wherein exposure, post-exposure thermal treatment or development induces a further reaction of the cleavage product.

14. The method of claim 11 wherein the cleavage product has multiple anions or acidic groups.

15. The method of claim 11 wherein the photoresist coating layer is exposed to radiation having a wavelength of less than 200 nm.

16. The method of claim 11 wherein the photoresist coating layer is exposed to radiation having a wavelength of about 193 nm.

17. The method of claim 15 wherein the photoacid-labile unit comprises an acetal group.

18. The method of claim 15 wherein the polymer is completely free of aromatic units.

19. The method of claim 15 wherein the polymer is not crosslinked to another polymer.

20. A method for forming a photoresist relief image on a substrate, comprising:

a) applying a coating layer of a photoresist composition on a substrate, the photoresist composition comprising a photoactive component and a resin binder that comprises a polymer that comprises a photoacid-labile unit that can generate multiple anions or acidic groups from a photoacid-induced deprotection reaction, and wherein the polymer is not crosslinked to another polymer; and b) exposing and developing the photoresist coating layer to provide a relief image on the substrate.

21. The method of claim 20 wherein exposure results in a deblocking reaction of the polymer of the photoresist composition and provides a cleavage product of the polymer.

22. The method of claim 21 wherein exposure, post-exposure thermal treatment or development induces a further reaction of the cleavage product.

23. The method of claim 21 wherein the cleavage product has multiple anions or acidic groups.

24. The method of claim 17 wherein the photoresist coating layer is exposed to radiation having a wavelength of about 248 nm.

25. The method of claim 24 wherein the polymer comprises phenolic groups.

26. The method of claim 24 wherein the photoacid-labile unit comprises an acetal group.

* * * * *